United States Patent [19]
Van Berkel

[11] Patent Number: 5,371,351
[45] Date of Patent: Dec. 6, 1994

[54] IMAGING DEVICE WITH ELECTROSTATIC DISCHARGE PROTECTION

[75] Inventor: Cornelis Van Berkel, Hove, England

[73] Assignee: U.S. Philips Corporation, New York, N.Y.

[21] Appl. No.: 152,558

[22] Filed: Nov. 12, 1993

[30] Foreign Application Priority Data

Dec. 23, 1992 [GB] United Kingdom ............. 9226890.3

[51] Int. Cl.⁵ .............................................. H01J 40/14
[52] U.S. Cl. ............................ 250/208.1; 257/443; 348/308
[58] Field of Search ........ 250/208.1, 214 AL, 214 LS, 250/208.3, 214 L; 257/443, 445; 348/308, 309, 307, 302

[56] References Cited

U.S. PATENT DOCUMENTS

| | | | |
|---|---|---|---|
| 4,233,632 | 11/1980 | Akiyama | 348/308 |
| 4,609,824 | 9/1986 | Munier | 250/578 |
| 5,268,765 | 12/1993 | Yamashita | 250/208.1 |

FOREIGN PATENT DOCUMENTS

| | | |
|---|---|---|
| 0237365 | 3/1990 | European Pat. Off. |
| 0423824 | 4/1991 | European Pat. Off. |
| 0440282 | 7/1991 | European Pat. Off. |
| 62-198826 | 2/1987 | Japan |
| 2061618 | 8/1988 | Japan |
| 1303416 | 7/1989 | Japan |
| 261618 | 1/1990 | Japan |

Primary Examiner—David C. Nelms
Assistant Examiner—Que T. Le
Attorney, Agent, or Firm—John C. Fox

[57] ABSTRACT

An imaging device (1a, 1b) has an array (2) of imaging elements (3) each having an associated switching element (4), data signal conductors (5) connected to the imaging elements (3) and switching signal conductors (6) connected to the switching elements (4) for enabling each imaging element (3) to be accessed individually by selecting the associated switching and data signal conductors and a reference conductor (7). A photosensitive protector (8) is connected between the reference conductor (7) and the data signal and switching signal conductors (5 and 6) for providing a low resistance path from the data and switching signal conductors to the reference conductor (7) when the photosensitive protector (8) is illuminated. The photosensitive protector (8) is formed, for each data signal conductor and for each switching signal conductor, by at least one rectifying element (8a) which is reverse-biased in normal operation of the imaging device (1a, 1b) and the photosensitive means (8) are shielded from incident light during normal operation of the imaging device.

21 Claims, 3 Drawing Sheets

IMAGING DEVICE WITH ELECTROSTATIC DISCHARGE PROTECTION

BACKGROUND OF THE INVENTION

This invention relates to an imaging device, for example a large area image sensor formed using thin film technology on an insulating substrate or a display device such as a liquid crystal display (LCD) device, and in particular to such a device which incorporates protection against electrostatic discharge damage.

JP-A-2 61618 describes an imaging device comprising an array of imaging elements each having an associated switching element, data signal conductors connected to the imaging elements and switching signal conductors connected to the switching elements for enabling each imaging element to be accessed individually by selecting the associated switching and data signal conductors, reference conductor means and photosensitive protection means connected between the reference conductor means and the data signal and switching signal conductors for providing a low resistance path from the data and switching signal conductors to the reference conductor means when the photosensitive protection means are illuminated.

The device described in JP-A-2 61618 is an active matrix addressed LCD device in which the switching elements for controlling addressing of the imaging, in this case display, elements are in the form of thin film insulated gate field effect transistors (TFTs). The data and switching signal conductors are connected to the reference conductor means (which, as shown, consists of several reference conductors) by semiconductor films having a resistance which decreases when the films are illuminated. Thus, during manufacture of the device, the normally occurring illumination of the device will cause the semiconductor films to short the data and switching signal conductors to the reference conductors so inhibiting electrostatic damage which might otherwise occur during, for example, handling of the device. During electrical inspection of the device the semiconductor film is not illuminated, the data and switching signal conductors are thus not shorted and their electrical properties can therefore be tested. After the electrical inspection, the connection between the data and switching signal conductors and the reference conductors is removed by selectively etching the reference conductors.

The English language Abstracts for JP-A-62 198826 and JP-A-1 303416 similarly describe the use of photosensitive resistors made concurrently with the switching TFTs to connect the data and switching signal conductors to reference conductor means.

Although the use of such photosensitive resistors enables some electrostatic (ESD) protection, the resistance of the resistors may be too high to provide a satisfactory shorting of the data and switching signal conductors to the reference conductor means under illumination yet be sufficiently low when the resistors are not illuminated to make it necessary, as described in JP-A-2 61618, to selectively etch away parts of the reference conductors so as to avoid the possibility of undesired electrical paths in the completed and tested device. Also, because the photosensitive resistors will generally require a different composition of material from the imaging elements, extra masking and deposition steps will generally be needed to form the photosensitive resistors.

OBJECTIVES AND SUMMARY OF THE INVENTION

It is an aim of the present invention to provide an imaging device having electrostatic discharge protection in which the above mentioned problems are at least mitigated.

According to one aspect of the present invention, there is provided an imaging device comprising an array of imaging elements each having an associated switching element, data signal conductors connected to the imaging elements and switching signal conductors connected to the switching elements for enabling each imaging element to be accessed individually by selecting the associated switching and data signal conductors, reference conductor means and photosensitive protection means connected between the reference conductor means and the data signal and switching signal conductors for providing a low resistance path from the data and switching signal conductors to the reference conductor means when the photosensitive protection means are illuminated, characterised in that the photosensitive protection means comprises for each data signal conductor and for each switching signal conductor at least one rectifying element which is reverse-biased in normal operation of the imaging device and in that the photosensitive protection means are shielded from light incident on the array during normal operation of the imaging device.

Thus in an imaging device in accordance with the invention, the use of rectifying elements means that the resistance of the connection between the data and switching signal conductors and the reference conductor means as much lower under illumination than that provided by photosensitive resistors yet considerably higher than that provided by photosensitive resistors when the protection means are not illuminated. Also as the photosensitive protection means are shielded from any light incident on the array during normal operation of the imaging device, the photosensitive rectifying elements automatically provide isolation of the array from the reference conductor during normal operation of the device.

In another aspect, the present invention provides a kit of parts for forming an imaging device comprising a first substrate carrying an array of imaging elements each having an associated switching element, data signal conductors connected to the imaging elements and switching signal conductors connected to the switching elements for enabling each imaging element to be accessed individually by selecting the associated switching and data signal conductors, reference conductor means and photosensitive protection means comprising, for each data signal conductor and each switching signal conductor, at least one rectifying element which is reverse-biassed in normal operation of the imaging device connected between the reference conductor means and the associated signal conductor for providing a low resistance path from the data and switching signal conductors to the reference conductor means when the photosensitive protection means are illuminated, a second substrate carrying control circuitry for controlling operation of the array, and means for assembling the imaging device by mounting the second substrate to the first substrate so that once the imaging device is assembled the photosensitive protection means is shielded from any light incident on the array.

The present invention also provides a method of manufacturing an imaging device comprising providing on a first substrate an array of imaging elements each having an associated switching element, data signal conductors connected to the imaging elements and switching signal conductors connected to the switching elements for enabling each imaging element to be accessed individually by selecting the associated switching and data signal conductors, reference conductor means and photosensitive protection means comprising, for each data signal conductor and each switching signal conductor, at least one rectifying element which is reverse-biassed in normal operation of the imaging device connected between the reference conductor means and the associated signal conductor for providing a low resistance path from the data and switching signal conductors to the reference conductor means when the photosensitive protection means are illuminated, providing on a second substrate control circuitry for controlling operation of the array, and assembling the imaging device by mounting the second substrate to the first substrate so that the photosensitive protection means is shielded from any light incident on the array.

Thus during manufacture and handling of the array, the photosensitive protection means can be illuminated so as to short the signal conductors to the reference conductor means to inhibit the possibility of electrostatic discharge damage which might otherwise inadvertently arise during handling while, once the imaging device is assembled, the photosensitive protection means are automatically shielded from light incident on the array and so provide effective isolation of the array from the reference conductor during normal operation of the device.

The photosensitive protection means may comprise, for each data signal conductor and for each switching signal conductor, at least one series connection of two rectifying elements connected back-to-back so that one of the rectifying elements is reverse biased when a voltage of one polarity is applied across the photosensitive protection means and the other one of the rectifying elements is reverse biased when a voltage of the opposite polarity is applied across the photosensitive protection means. This should ensure that when the protection means are not illuminated good electrical isolation of the data and switching signal conductors from the reference conductor means is provided regardless of the polarity of the voltage applied across the protection means.

Each rectifying element generally comprises a photosensitive diode, although other possible rectifying elements such as diode-connected TFTs or MIMs could be used.

The imaging elements generally comprise photosensitive elements so that the device forms an image sensing device. The photosensitive elements may be photosensitive diodes. This is advantageous from the point of view of ESD protection because the photosensitive diodes forming the imaging elements are of course designed to be exposed to light and thus are not particularly sensitive to ESD problems. Where the imaging elements are photosensitive elements, the imaging elements and rectifying elements may advantageously be the same type of device, for example the imaging and rectifying elements may both be photosensitive diodes, MIMs or diode-connected TFTs. This means that the imaging and rectifying elements can all be formed at the same time using the same technology so that there is no need for separate deposition steps.

The imaging elements may comprise display elements. Thus, for example, the device could be an actively addressed display such as a liquid crystal display device or it could be a combined display and image sensing device with, for example, each display element having an associated photosensitive element.

The switching elements may comprise diodes, although any other suitable switching element, such as TFT or thin film diode (MIM) may be used. Forming the switching elements, imaging elements and protection rectifying elements all as diodes has advantages in enabling them all to be formed simultaneously.

The imaging, switching and rectifying elements are generally formed by thin films provided on an insulating substrate but it is possible that they could be formed as bulk semiconductor devices within a bulk semiconductor.

Generally, the array comprises a two-dimensional array of imaging elements arranged in rows and columns; however, the array could be a linear array.

Usually, the reference conductor means consists of a common reference conductor. However two or more separate reference conductors could be provided.

BRIEF DESCRIPTION OF THE DRAWINGS

Embodiments of the present invention will now be described, by way of example, with reference to the accompanying drawings, in which.

It should of course be understood that the drawings are merely schematic and are not to scale. Thus, for example, certain dimensions such as the thickness of layers may have been relatively exaggerated in the interests of clarity. Like reference numerals are used throughout to refer to like parts.

DESCRIPTION OF THE PREFERRED EMBODIMENT(S)

Figure 1:
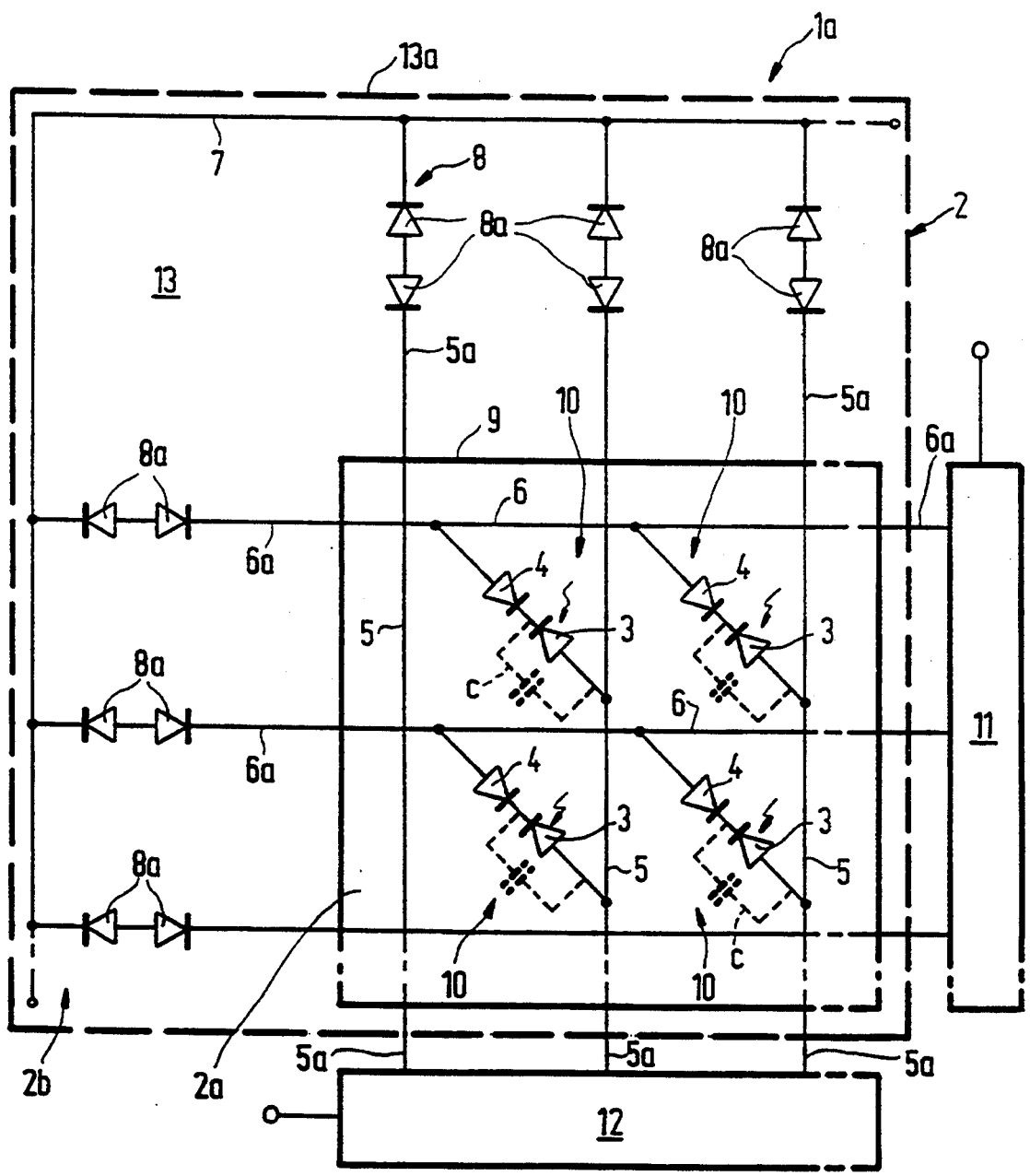
FIG. 1 is a schematic circuit layout for one embodiment of an imaging device in accordance with the invention.

Referring now to the drawings, there is illustrated an imaging device 1a, 1b comprising an array 2 of imaging elements 3 each having an associated switching element 4, data signal conductors 5 connected to the imaging elements 3 and switching signal conductors connected to the switching elements 4 for enabling each imaging element 3 to be accessed individually by selecting the associated switching and data signal conductors, reference conductor means 7 and photosensitive protection means 8 connected between the reference conductor means 7 and the data signal and switching signal conductors 5 and 6 for providing a low resistance path from the data and switching signal conductors to the reference conductor means 7 when the photosensitive protection means 8 are illuminated. In accordance with the invention, the photosensitive protection means 8 comprises, for each data signal conductor and for each switching signal conductor, at least one rectifying element 8a which is reverse-biased in normal operation of the imaging device 1a, 1b and the photosensitive means 8 are shielded from incident light during normal operation of the imaging device. Thus in an imaging device in accordance with the invention, the use of the rectifying elements 8a means that the resistance of the connection between the data and switching signal conductors 5 and 6 and the reference conductor means 8 is much lower under illumination than that which would be provided by photosensitive resistors yet considerably higher than that provided by photosensitive resistors when tile protection means 8 are not illuminated.

Referring now specifically to the drawings, FIG. 1 illustrates a schematic circuit layout for one embodiment of an imaging device 1a in accordance with the invention.

In the example shown in FIG. 1, the imaging device 1a is an image sensor in which the imaging elements 3 are in the form of photosensitive elements arranged in a two-dimensional array 2. The photosensitive elements 3 are shown as photodiodes, generally p-i-n photosensitive diodes although other photosensitive elements such as photosensitive transistors (bipolar or field effect) or photosensitive resistors could be used. Similarly in the example illustrated in FIG. 1, the switching elements 4 are formed by diodes, generally p-i-n diodes, although other two-terminal switching elements such as thin film diodes (MIMs) could be used. In this case, the photodiodes 3 and switching diodes 4 are formed using thin film technology on a substrate 13 as will be described in greater detail below with reference to FIGS. 2 and 3.

As is well known in the art, in operation charge is stored by the intrinsic capacitance of the photodiodes 3. An additional capacitor C (shown in phantom lines in FIG. 1) may be connected across each photodiode 3 to improve the dynamic range of the image sensor 1a.

In the example illustrated in FIG. 1, the data signal and switching signal conductors 5 and 6 define a regular matrix of m rows and n columns so that the data signal and switching signal conductors 5 and 6 define column and row conductors, respectively. Generally, the array 2 may consist of up to 2000×2000 pixels imaging areas 10 each of which has its own photosensitive element 3 and switching element 4 and is addressed or accessed by a unique pair of data signal and switching signal conductors 5 and 6. In the interests of simplicity, only four complete pixels 10 are shown in FIG. 1. The active area of the image sensor 1a, that is the area encompassing the photosensitive elements 3 and switching elements 4 is shown bounded by a bold solid line 9.

In the example illustrated in FIG. 1, each photodiode 3 is connected back-to-back with the associated switching diode 4 so that their anodes are connected together with the cathode of each switching diode 4 being connected to the associated switching signal conductor 6 and the cathode of the photodiode 3 being connected to the associated data signal conductor 5.

In operation of the image sensor 1a, light incident on a photodiode 3 generates photo-charge which is stored on the photodiode self-capacitance, $C_p$, and the switching diode 4 capacitance, $C_d$, which are effectively in parallel. Two conditions must be satisfied for the photodiode to generate and store charge correctly: firstly, the photodiode must be reverse-biassed; otherwise the photogenerated charge would be reduced by a forward current; and secondly, the row potential must be such that the switching diode is also reverse-biassed. Readout of the photo-charge is achieved by applying a positive potential to the row conductor 6. The switching diode 4 is then forward-biassed, and a current flows through the pixel 10 from row 6 to column 5 conductor and recharges $C_p$ to its starting point (and, in the process, reversing biassing the photodiode 3). With appropriate reversal of voltage polarities, the diodes 3 and 4 may be reversed so that their cathodes are connected.

The row conductors 6 are connected via row leadout lines 6a to a row driver or decoder/addressing circuitry 11 while the column conductors 5 are connected via column lead out lines 5a to a column read-out or decoder/circuitry 12 which includes an appropriate charge sensitive amplifier. A read-out arrangement of the type described in EP-A-440282 could also be used. Generally, as the drive circuitry 11 and 12 may require different manufacturing technology, for example bulk monocrystalline silicon as opposed to amorphous silicon thin film transistors (TFTs), the circuitry 11 and 12 is provided on a separate printed circuit board to which connection is made via the lead-out lines 5a and 6a. Although this will be described in somewhat greater detail with reference to FIG. 3, the fact that the circuitry 11 and 12 is provided on a separate substrate is indicated schematically in FIG. 1 by the dashed boundary line 13a which shows the periphery of the substrate 13 carrying the array 2.

As can be seen from FIG. 1, the row and column lead out lines 6a and 5a extend on the substrate 13 beyond the active area 2a of the array 2 into a peripheral portion 2b and are connected via the photosensitive protection means 8 to the reference conductor means 7.

In this example, the photosensitive protection means 8 comprises a number of rectifying elements 8a in the form of photosensitive diodes which will generally be of the same type and structure as the photosensitive diodes 3 but of the order of four times the area so as to provide sufficient current carrying capacity. The photosensitive diodes 8a are arranged so that each row and each column lead out line 5a and 6a is connected to the reference conductor 7 by a respective pair of back-to-back connected photosensitive diodes 8a. In the example illustrated in FIG. 1, the pairs of photosensitive diodes 8a are connected so that their anodes are joined together; however this arrangement could be reversed.

Figure 2:
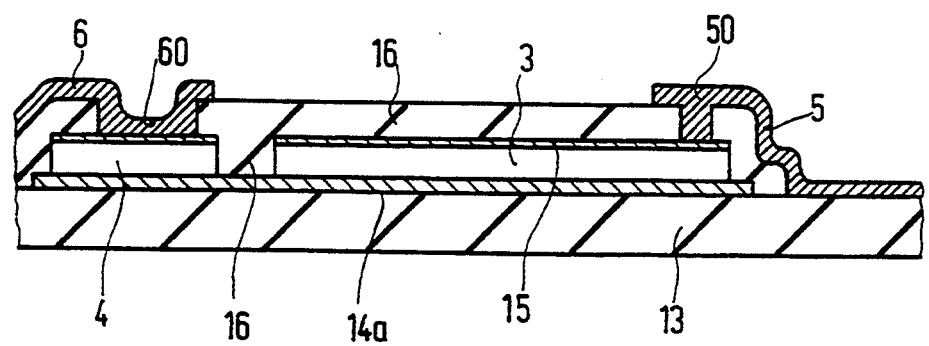
FIG. 2 is a schematic cross-sectional view through part of one example of an imaging element of an imaging device having the circuit layout shown in FIG. 1.
Figure 3:
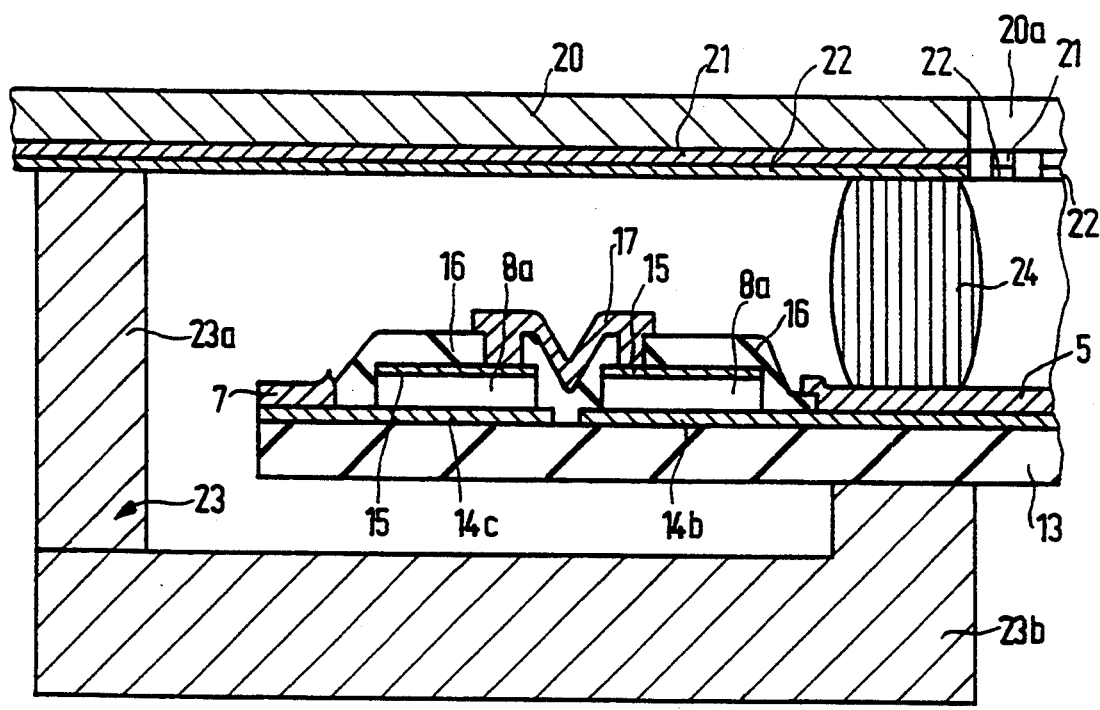
FIG. 3 is a schematic cross-sectional view through part of one example of a peripheral area of an imaging device having the circuit layout shown in FIG. 1.
Figure 4:
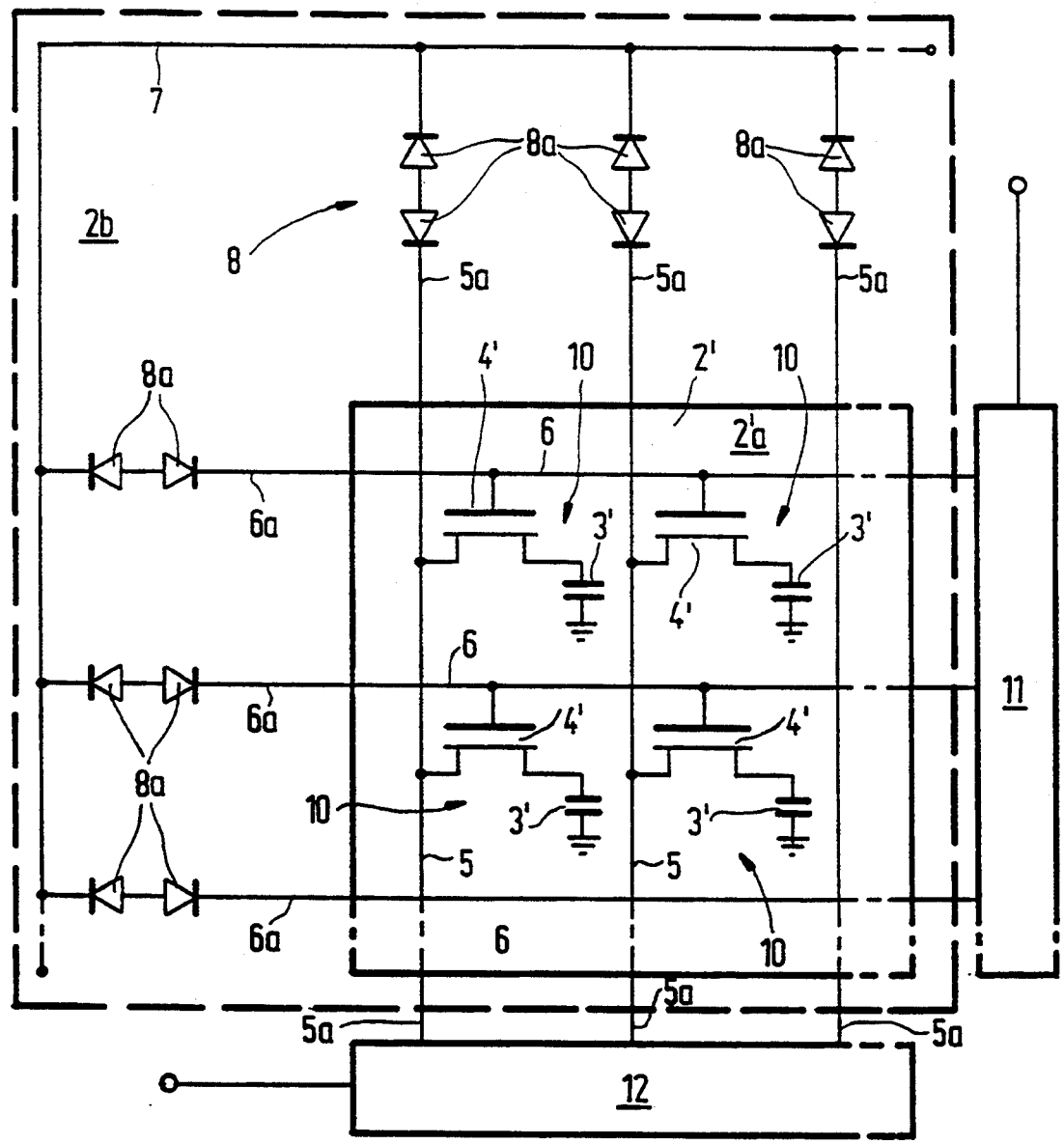
FIG. 4 is a schematic circuit layout for another embodiment of an imaging device in accordance with the invention.

FIGS. 2 and 3 are cross-sectional views illustrating schematically part of an image area or pixel 10 and part of the peripheral portion 2b of one example of an image sensor having the layout shown in FIG. 1. The cross-section of FIG. 2 is taken approximately during a line passing along a row conductor, then through the switching and photosensitive diodes 4 and 3 of a pixel area and along the associated column conductor while the cross-section of FIG. 3 is taken approximately along a column lead-out line 5a through the associated protection photodiodes 8a.

The insulating substrate 13 is generally formed of a suitable glass although any suitable plastics material or other suitable insulating material. Where illumination through the substrate 13 is required, then the substrate 13 should, of course, be transparent to the wavelengths to be detected by the photosensitive elements 3, generally visible light, may be used.

A first metallisation layer opaque to light to which the photosensitive diodes 3 and 8a are sensitive, generally chrome, is provided on the insulating substrate and patterned using conventional photolithographic and etching techniques to define the common anode electrode 14a of the switching and photosensitive diodes 3 and 4 of each image area or pixel 10, and the separate anode electrodes 14b and 14c of the protection photosensitive diodes 8a. The diodes are then formed by depositing in sequence n conductivity type, intrinsic and p conductivity type semiconductor layers. Generally, the semiconductor layers will be formed of amorphous silicon, usually hydrogenated, although other suitable semiconductor materials could be used. A transparent electrically conductive layer, generally an indium tin oxide layer, may be provided over the n-i-p layers. The deposited layers are then patterned to define the respective n-i-p diode structures 3, 4a and 8a covered by respective ITO layers 15. In the interests of simplicity, the n-i-p diode structures are shown unhatched. An insulating layer 16 which is transparent to light, and to which the photodiodes 3 and 8a are sensitive, is then deposited and patterned to provide windows for enabling electrical contact to be made. A further metallisation layer opaque to light, and to which the photodiodes 3 and 8a are sensitive, is then deposited and patterned to define row and column conductors 5 and 6 which also provide the connections 50 and 60 to the cathodes, in this case, of the photosensitive diodes 3 and switching diodes 4 and the connections 5a and 6a to the anodes of the innermost one of each pair of back-to-back photodiodes 8a, the metallisation 17 connecting the cathodes of each pair of protection photodiodes 8a and the reference conductor means 7 which in this example comprises a single common conductor. Although probably not necessary, the area of insulating material 16 extending over the photosensitive diodes 3 (and diodes 8a) beyond the contacts 50 (and 17) may be removed by etching using an appropriate mask so as to avoid any degradation of the incident light signal by the insulating material 16. If considered desirable, the active area 2a may be covered by a transparent passivating layer, for example a polyimide layer; however, generally the peripheral area 2b will not be so covered.

The opaque further metallisation layer also serves, as shown by the region 60 in FIG. 2, to shield the switching diodes 4 from any incident light.

Once the array 2 has been completed, it is necessary to mount the array 2 to a generally opaque substrate carrying the addressing and read-out circuitry 11 and 12. This is illustrated schematically by FIG. 3 which shows the connection of a substrate 20 carrying the addressing and read-out circuitry 11 and 12 to the array 2. For consistency with FIG. 2, FIG. 3 is actually shown upsidedown. The substrate 20 which is generally opaque has a central aperture 20a within which the array 2 sits when the device is assembled. The substrate 20 carries metallisation tracks which radiate outwardly from the aperture 20a. Each metallisation track (only one of which is shown) generally consists of a copper layer 21 covered by a gold layer 22 and provides a connection between an associated lead at line 5a or 6a and the circuitry 11 or 12.

Any suitable method may be used to provide the necessary connection between the metallisation tracks 21, 22 and the lead out lines 5a and 6a of the array 2. In the example illustrated in FIG. 3, a method which is commonly used in the fabrication of liquid crystal display devices is used. Thus, a so-called hairy mat 24, that is a mat made up of carbon or the like conductive fibres arranged so as to extend between the substrate 20 and the array 2 so as to conduct electricity in a direction perpendicular to the substrate 20 and the array 2 but not in a direction parallel to the substrate 20 and the array 2, is provided between the substrate 20 and the array 2 so as to provide the necessary connection between each lead-out line 5a or 6a and the associated conductive track 21, 22 while isolating adjacent lead-out lines 5a, 6a from one another. A clamp 23 is used to secure the substrate 20 to the array 2. Again, the clamp 23 may be of known form and generally will consist of bridging members 23a which extend over and are spaced from the tracks 21, 22 and which are secured by means of screws or the like to areas of the substrate 20 away from the metallisation tracks 21, 22 and the circuitry 11, 12 and clamping areas 23b secured by screws or similar connections to the bridging members 23a so as to bear down upon the insulative substrate 13 of the array 2, As will be appreciated by those skilled in the art, the central aperture 20a in the substrate 20 allows light to pass to the array 2 while the substrate 20 itself serves to shield the protection means 8 from any light incident on the array 2. The manufacturing and subsequent mounting procedure necessitates some handling of the array 2 and therefore involves the possibility of electrostatic charge building up on the capacitive components of the array 2 which could damage the components of the array 2. However, because the handling of the array 2 necessary during processing and to mount the array to the substrate 20 is carried out in the light, that is under illumination, the photosensitive protection diodes 8a provide a low resistance path to the reference conductor areas 7 which, as shown in FIG. 1, provides a common electrical path and so shorts the row and column conductors 5 and 6 thereby effectively shorting out all the pixels 10 and dissipating any electrical charge. Generally, the reference conductor means 7 will be connected to a suitable reference potential such as earth (ground) although this may not be necessary if there is a single common reference conductor 7.

Once the array is mounted to the substrate 20, the protection photosensitive diodes 8a are shielded by the substrate 20 from any external light sources because of their positioning at the periphery of the array 2 beyond the row and column lead out lines 5a and 6a. Under these conditions the back-to-back protection diodes 8a isolate the row and column conductors 5 and 6 from the reference conductor means 7 so that the imaging device 1a can be operated normally. Thus, protection against electrostatic discharge is provided right up to the moment it is no longer required, that is when the imaging device has been assembled. To minimise the effect of any capacitive cross-talk which might arise from the presence of the protection diodes 8a in the completed device 1a, the reference conductor means 7 is preferably maintained at ground (earth) potential or other suitable fixed voltage during operation of the imaging device 1a.

It should of course be noted that the hairy mat 24 generally will have a thickness of about 100 $\mu$m and will act as a spacer so ensuring that the protection diodes 8a are separated and insulated from the substrate 20.

The opaque substrate 20 serves to shield the protection diodes 8a from any light incident on the portion of the substrate 13 directly beneath the protection diodes 8a. There is a remote possibility that light guided through the transparent substrate 13 may be reflected by the substrate 20 and the metal layers 21 and 23 carried thereby onto the photosensitive protection diodes 8a, however this may be avoided by providing additional light shielding between the peripheral portion 2b of the array and the substrate 20, for example by filling the space with an opaque insulating paste such as, for example, a black polyimide.

In addition, although not shown in FIG. 1, a degree of redundancy may be incorporated into the photosensitive protection means 8 by providing, for each row and column conductor 5 and 6, a series connection of two pairs of back-to-back diodes 8a so that if one diode fails and short-circuits the row or column conductor concerned is still isolated from the reference conductor means 7 during normal operation of the image sensor 1a.

The presence of the protection means 8 may also be used to allow individual testing of the row and column conductors and individual pixels by, before assembly of the array 2 with the substrate 20, selectively illuminating protection diodes 8a to short out only selected row and column conductors.

It should of course be appreciated that the pixels 10 may have a different form from that shown in FIG. 1. Thus, for example, each photosensitive element 3 and the associated switching element 4 may be formed by a single diode as in, for example, EP-A-233104. In addition although the formation of the photosensitive elements 3, switching element 4 and protection elements 8a all as p-i-n diodes has advantages in simplifying manufacturing, these elements need not all be the same. Thus, for example the switching elements could be other two terminal devices such as non-linear resistance elements such as MIMs or three terminal devices such as bipolar or unipolar transistors, for example a circuit layout of the type shown in EP-A-237365 or US-A-4609824 or any other suitable layout could be used. Also, the photosensitive elements 3 could be photosensitive transistors or MIMs or any other suitable photosensitive element. Similarly, the protection photosensitive elements 8a could be formed by any suitable rectifying photosensitive elements for example Schottky diodes, diode-connected TFTs or MIMs. Generally, for simplicity and ease of manufacture, it is desirable for the photosensitive rectifying elements 8a and the photosensitive imaging elements 3 to be of the same type of device, for example both photosensitive diodes or both photosensitive MIMs.

The imaging device need not necessarily be an image sensor but could be a display device in which the imaging elements 3 are display elements, for example liquid crystal display elements or indeed could be a combined display device and image sensor in which each pixel includes a photosensitive element as well as a display element.

FIG. 5 illustrates a schematic circuit layout for one example of an array 2' for an imaging device 1b in accordance with the invention of which the switching elements are formed as TFTs 4' each having their gate or control electrode connected to the respective row conductor 6 and one of their main (drain) electrodes connected to tile associated column conductor 5. In this example, in the active area 2'a each imaging element 3' is shown simply as a capacitor. The capacitor 4' may comprise liquid crystal cells or may be representative of photosensitive elements such as photosensitive diodes or a combination of the two in parallel. The peripheral area 2'b of the array 2' is similar to that shown in FIG. 1 with the driving or decoder circuitry 11 and read-out circuitry 12 being formed as is appropriate for an image sensor or display as the case may be. For further details of possible structures where the imaging device 1b is a liquid crystal display device reference may be made to diverse publications, see for example EP-A-271960.

In each of the above-described examples, the photosensitive protection means 8 comprises an individual pair of back-to-back diodes 8a for each row and column conductor 5 and 6. However it may be possible to have a single protection diode 8 for each row respective row and column conductor 5 and 6 if effective isolation is only required during normal operation of the imaging device for one voltage polarity. Also, the reference conductor means may comprise more than one reference conductor. Thus, especially when there is only one rectifying element 8a associated with each lead out line, there may be a separate reference conductor 7 for the column conductors 5 and a separate reference conductor 7 for the row conductors 6 with each reference conductor being connected to a respective suitable low impedance reference potential. The use of a single reference conductor 7 may have advantages in that it should cause the imaging elements to be shorted out during illumination of the photosensitive protection means 8. However, the use of separate reference conductors should not present problems for the imaging elements 3 where these are photosensitive because they should be illuminated, and thus not suscepible to ESD damage, during assembly.

From reading the present disclosure, other modifications and variations will be apparent to persons skilled in the art. Such modifications and variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An imaging device comprising an array of imaging elements each having an associated switching element, data signal conductors connected to the imaging elements and switching signal conductors connected to the switching elements for enabling each imaging element to be accessed individually by selecting the associated switching and data signal conductors, reference conductor means and photosensitive protection means connected between the reference conductor means and the data signal and switching signal conductors for providing a low resistance path from the data and switching signal conductors to the reference conductor means when the photosensitive protection means are illuminated, characterised in that the photosensitive protection means comprises, for each data signal conductor and for each switching signal conductor at least one rectifying element which is reverse-biassed in normal operation of the imaging device and in that the photosensitive protection means are shielded from incident light during normal operation of the imaging device.

2. An imaging device according to claim 1, wherein the photosensitive protection means comprises, for each data signal conductor and for each switching signal conductor, at least one series connection of two rectifying elements connected back-to-back so that one of the rectifying elements is reverse biased when a voltage of one polarity is applied across the photosensitive protection means and the other one of the rectifying elements is reverse-biased when a voltage of the opposite polarity is applied across the photosensitive protection means.

3. An imaging device according to claim 1, wherein each rectifying element comprises a photosensitive diode.

4. An imaging device according to claim 1, wherein the imaging elements comprise photosensitive elements.

5. An imaging device according to claim 4, wherein the photosensitive elements comprise photosensitive diodes.

6. An imaging device according to claim 4, wherein the rectifying elements and the imaging elements are formed by the same type of device.

7. An imaging device according to claim 1, wherein the imaging elements comprise display elements.

8. An imaging device according to claim 7, wherein the display elements comprise liquid crystal display elements.

9. An imaging device according to claim 1, wherein the switching elements comprise diodes.

10. An imaging device according to claim 1, wherein the imaging, switching and rectifying elements are formed by thin films provided on an insulating substrate.

11. An imaging device according to claim 1, wherein the reference conductor means consists of a common reference conductor.

12. An imaging device according to claim 1, wherein the photosensitive means are shielded from incident light during normal operation of the device by circuitry for controlling operation of the device.

13. An imaging device according to claim 6, wherein the imaging elements comprise display elements.

14. An imaging device according to claim 2, wherein each rectifying element comprises a photosensitive diode.

15. An imaging device according to claim 2, wherein the imaging elements comprise photosensitive elements.

16. An imaging device according to claim 3, wherein the imaging elements comprise photosensitive elements.

17. An imaging device according to claim 2, wherein the imaging elements comprise display elements.

18. An imaging device according to claim 3, wherein the imaging elements comprise display elements.

19. An imaging device according to claim 4, wherein the imaging elements comprise display elements.

20. An imaging device according to claim 5, wherein the imaging elements comprise display elements.

21. A method of manufacturing an imaging device comprising providing on a first substrate an array of imaging elements each having an associated switching element, data signal conductors connected to the imaging elements and switching signal conductors connected to the switching elements for enabling each imaging element to be accessed individually by selecting the associated switching and data signal conductors, reference conductor means and photosensitive protection means comprising, for each data signal conductor and each switching signal conductor, at least one rectifying element which is reverse-biassed in normal operation of the imaging device connected between the reference conductor means and the associated signal conductor for providing a low resistance path from the data and switching signal conductors to the reference conductor means when the photosensitive protection means are illuminated, providing on a second substrate control circuitry for controlling operation of the array, and assembling the imaging device by mounting the second substrate to the first substrate so that the photosensitive protection means is shielded from any light incident on the array.

* * * * *